United States Patent [19]
Fotouhi

[11] Patent Number: 6,037,828
[45] Date of Patent: Mar. 14, 2000

[54] TRANSMISSION LINE DRIVER WITH HIGH OUTPUT IMPEDANCE AT POWER OFF

[75] Inventor: Bahram Fotouhi, Cupertino, Calif.

[73] Assignee: Exar Corporation, Fremont, Calif.

[21] Appl. No.: 09/160,418

[22] Filed: Sep. 25, 1998

Related U.S. Application Data

[63] Continuation-in-part of application No. 08/948,281, Oct. 9, 1997.

[51] Int. Cl.[7] .................................................. H03K 17/62
[52] U.S. Cl. .......................... 327/404; 327/108; 327/401; 326/82
[58] Field of Search .................................... 327/389, 391, 327/401, 403, 404, 108, 109, 112, 427; 326/30, 82

[56] References Cited

U.S. PATENT DOCUMENTS

| | | | |
|---|---|---|---|
| 4,972,517 | 11/1990 | Kondou et al. | 327/108 |
| 5,463,326 | 10/1995 | Raje | 326/30 |
| 5,703,519 | 12/1997 | Crook et al. | 327/387 |
| 5,745,003 | 4/1998 | Wakimoto | 327/382 |
| 5,767,699 | 6/1998 | Bosnyak et al. | 326/86 |

*Primary Examiner*—Timothy P. Callahan
*Assistant Examiner*—An T. Luu
*Attorney, Agent, or Firm*—Townsend and Townsend and Crew LLP

[57] ABSTRACT

Circuit techniques for allowing the sharing of the same output terminals between transmission line drivers that comply with differing protocols. By inserting isolation transistors at the outputs of line driver circuits, and in a preferred embodiment along the current loop of a current-output line driver circuit, the invention allows the sharing of output pins while meeting all the power on and power off requirements of different protocols.

17 Claims, 3 Drawing Sheets

TRANSMISSION LINE DRIVER WITH HIGH OUTPUT IMPEDANCE AT POWER OFF

CROSS-REFERENCES TO RELATED APPLICATIONS

This application is a continuation-in-part of commonly-assigned, U.S. patent application Ser. No. 08/948,281, entitled "Isolation Circuit for I/O Terminal," by B. Fotouhi, filed Oct. 9, 1997.

BACKGROUND OF THE INVENTION

The present invention relates in general to integrated circuits, and in particular to a versatile and efficient transmission line driver circuit with high output impedance at power off.

Integrated circuits developed for applications such as data or telecommunication systems are often required to comply with certain transmission protocols and standardized interface specifications. The interface requirements vary depending on the standard. For example, the V.35 transmission line interface standard specifies a differential output signal of ±0.55 volts driving a T-shaped network of 50 Ohm resistors, while the V.28 (or RS232) standard requires a single-ended output voltage having an absolute magnitude larger than 5 volts, and exhibiting an output impedance greater than 300 ohms. These varying requirements, therefore, dictate the use of two separate driver circuits in order to comply with the separate standards.

Referring to FIG. 1, there is shown a typical current-output V.35 transmission line driver circuit. The circuit includes two current sources I1 and I2 each drawing a current Io, a network of current-steering transistors M1, M2, M3, and M4, and termination resistors R1, R2, and R3. Resistors R4, R5, and R6, constitute a transmission line termination at the far end of the line 100. Ideally, the resistances R1=R2=R4=R5=R=50 Ohms, and R3=R6=125 Ohms. In operation, when control signal C is high, transistors M2 and M3 turn on. As a result, the voltage at terminal T2 will be more positive than that of T1 by a voltage difference of 2R×Io. Conversely, when C is low, the voltage at terminal T1 will be more positive than that of T2 by a voltage difference if 2R×Io. This assumes that due to the matching of both resistive terminations, current Io splits equally between them.

A drawback of this circuit is that under power off conditions when both positive and negative power supply voltages are at ground, i.e., VDD=VSS=0 volt, it may cause excessive current drawn from transmission line 100. If the voltage levels at terminals T1 and T2 rise or fall one diode drop above or below ground under such a power off condition, intrinsic pn junctions in the filed effect transistors of the driver circuit would be forward biased drawing excessive currents from the terminals.

In order to provide a circuit that complies with different transmission line protocols, some circuits combine the various drivers on the same chip. For a transmitter-receiver circuit, for example, it is desirable to be able to share resources to achieve programmability, or to otherwise reduce cost (reduce package pin count, etc.). However, the power off current associated with the V.35 driver circuit shown in FIG. 1 would make this circuit unacceptable when the same output terminals are to be shared by, for example, an RS232 (V.28) driver. Therefore, this circuit would not allow the transmitter-receiver chip to programmably connect the appropriate driver the same pair of output pins that connect to the transmission line.

There is a need for circuit techniques that allow the sharing of the same output terminals between line driver circuitry complying with different transmission protocols.

SUMMARY OF THE INVENTION

The present invention allows the sharing of the same output terminals between transmission line drivers that comply with differing protocols. The invention allows the sharing of output pins, while meeting all the power on and power off requirements of different protocols. Broadly, the present invention inserts isolation switches between each terminal connecting to the transmission line and the outputs of the line driver circuitry. The isolation switches are designed to isolate the transmission lines from the active devices inside the line driver circuitry, without themselves introducing any current paths that disturb the operation of the driver circuit. In a specific embodiment, isolation switches are inserted in the current loop of a current-output type line driver circuit in a way that ensures even splitting of the current between transmission line termination resistors.

Accordingly, in one embodiment, the present invention provides a line driver circuit including a first current source, a second current source, a plurality of current-steering transistors coupled to the first current source and the second current source, and a plurality of isolation transistors coupled between the plurality of current-steering transistors and output terminals. The line driver circuit further includes a network of termination resistors coupled to the current-steering transistors.

In a more specific embodiment, the plurality of current-steering transistors includes a first pair of field effect transistors (FETs) coupled to the first current source, and a second pair of FETs coupled to the second current source. The plurality of isolation transistors includes a first pair of isolation FETs respectively coupled between the first pair of FETs and the output terminals, and a second pair of isolation FETs respectively coupled between the second pair of FETs and the output terminals.

A better understanding of the nature and advantages of the present invention may be gained with reference to the detailed description and the drawing below.

DESCRIPTION OF THE SPECIFIC EMBODIMENTS

Figure 1:
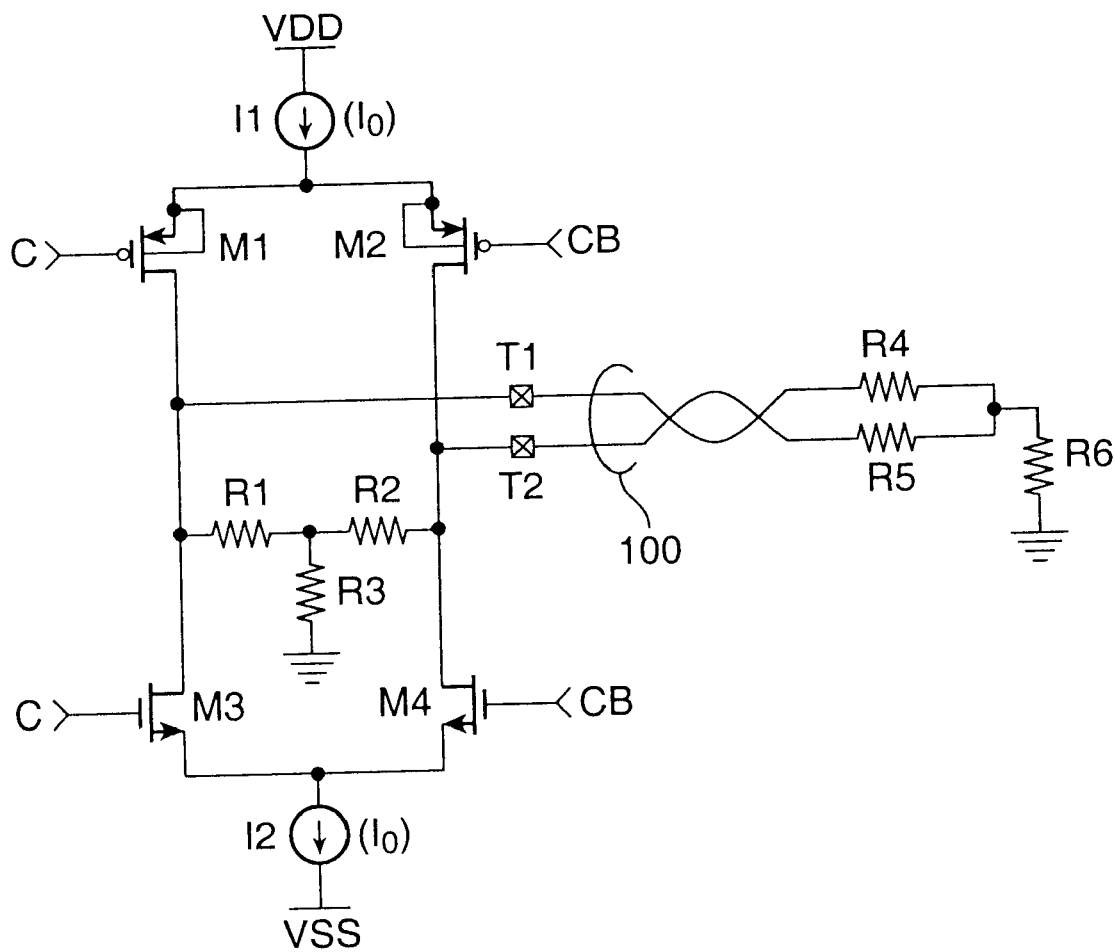
FIG. 1 is a circuit schematic of conventional V.35 current-output transmission line driver.
Figure 2:
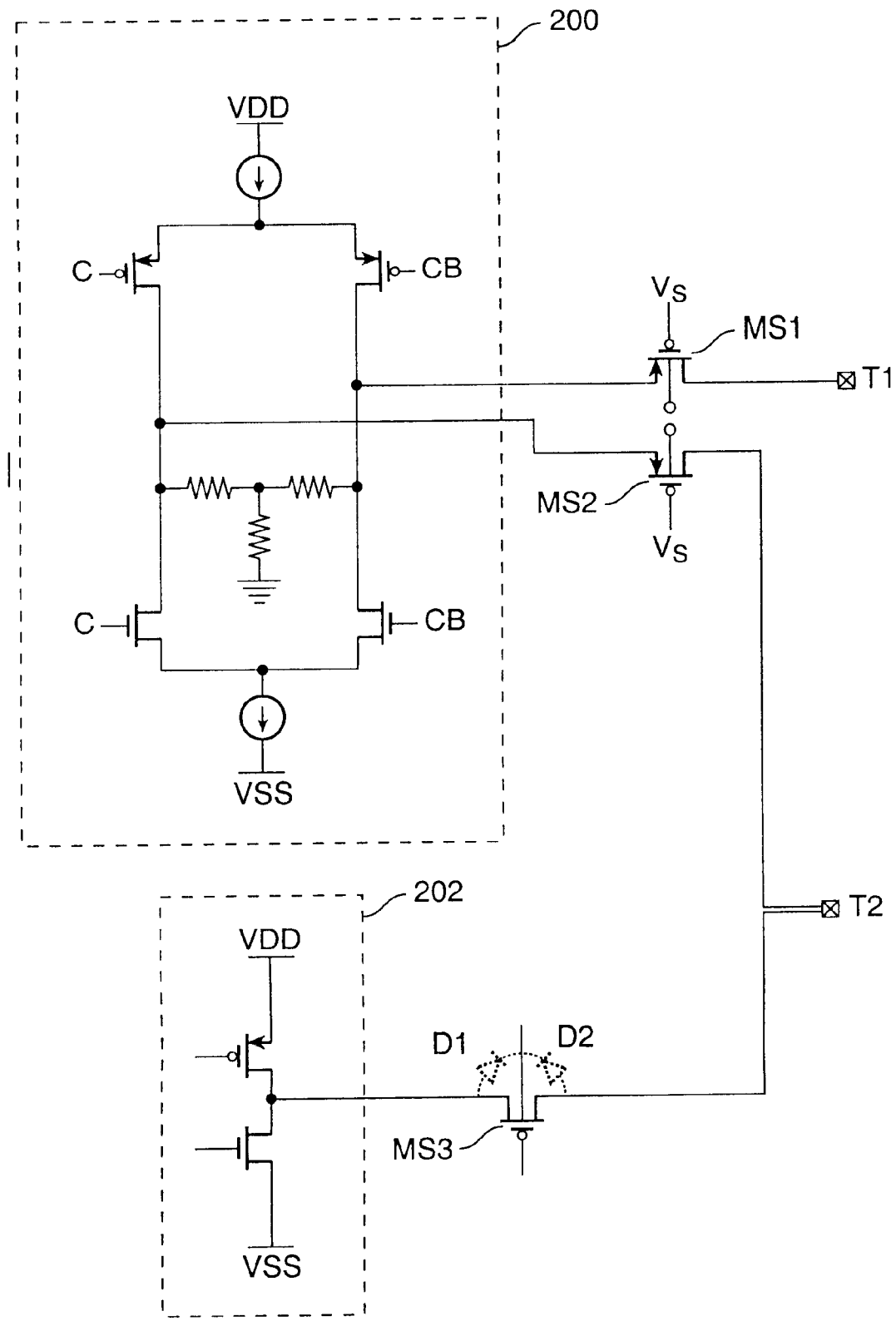
FIG. 2 shows a line driver circuit with isolation transistors according to one embodiment of the present invention.

In accordance with the teachings of the present invention, circuitry is provided to enable sharing of the same output terminals between transmission line driver circuits that comply with differing transmission protocols. Referring to FIG. 2, there is shown a simplified schematic of a current-output line driver circuit 200 that is suitable for, for example, V.35 applications, sharing output terminals T1 and T2 with another line driver 202 that is suitable for, for example, RS232 applications. To enable the sharing of the same output terminal (or output pad on the silicon die), a pair of isolation transistors MS1 and MS2 respectively connect between the differential outputs Vo1 and Vo2 of driver 200 and output terminals (or pads) T1 and T2. Similarly, a third isolation transistor MS3 connects between the output Vo3 of driver 202 and a shared output terminal T2. In the simplified embodiment shown in FIG. 2, an n-well CMOS process is assumed, and P-channel type transistors are used to implement MS1, MS2, and MS3, with their gate terminals connected to a control signal Vs. To ensure the isolation transistors are off even under power off condition, the switch control signal Vs is preferably generated by a circuit similar to that controlling the isolation transistors in the above-referenced parent patent application Ser. No. 08/948,281. The body terminal (or the connection to the n-well in which the transistor resides) for each isolation transistor MS1, MS2, and MS3 is left floating under power off condition. Thus, each p-channel isolation transistor MS1, MS2, and MS3 introduces a pair of intrinsic back-to-back pn junction diodes D1 and D2 as shown in the case of p-channel isolation transistor MS3. Accordingly, under power off condition, these diodes are reverse biased, and thus guarantee that terminals T1 and T2 are well isolated from the active devices in driver circuits 200 and 202. When power is supplied to the circuit, the body terminals of transistors MS1, MS2, and MS3 preferably connect to their respective source terminals to reduce their on resistance.

While transistors MS1, MS2, and MS3 provide the necessary isolation to enable the sharing of the output terminals, they may cause an imbalance in the termination of the transmission line. Imbalance in termination matching can be caused by the fact that isolation transistors MS1 and MS2 are placed in series with the termination resistors in the voltage loop of output driver 200. Thus, the on resistance of transistors MS1 and MS2 directly impacts the effective termination resistance seen by the transmission lines.

Figure 3:
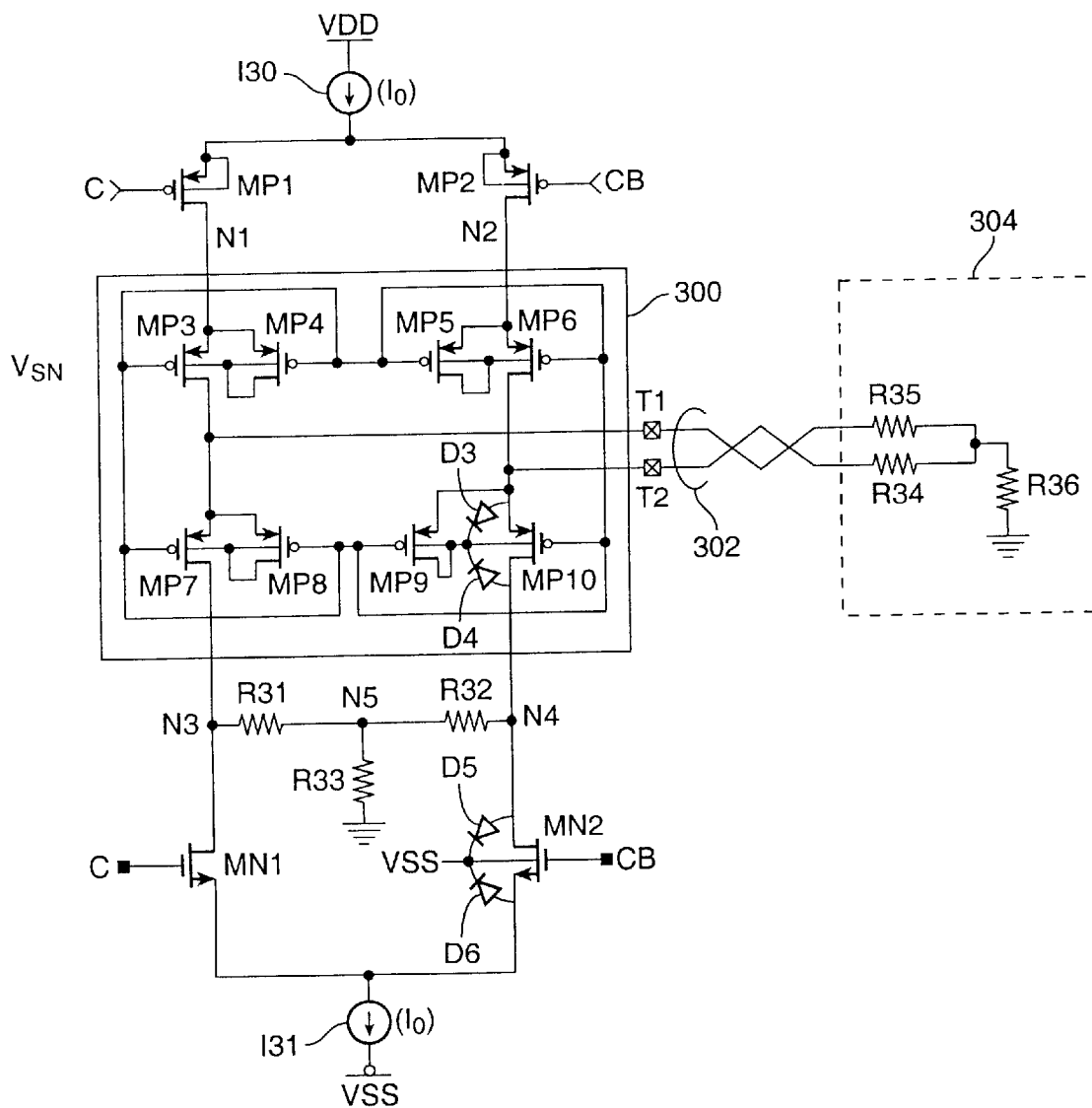
FIG. 3 is a circuit schematic of a transmission line driver circuit according to a second embodiment of the present invention.

The present invention provides an alternate embodiment for isolating the outputs of driver circuits that avoids this potential imbalance in termination matching. FIG. 3 is a circuit diagram for a current-output line driver circuit with isolation transistors. A first current source 130 connects between the positive power supply VDD and two p-channel current-steering transistors MP1 and MP2. Current-steering transistors MP1 and MP respectively receive control signals C and its complement CB at their gate terminals, and steer current from current source 130 into nodes N1 and N2 in response to C and CB. A second current source 131 connects between the negative power supply VSS and two n-channel current-steering transistors MN1 and MN2. Current-steering transistors MN1 and MN2 respectively receive control signals C and CB at their gate terminals, and steer current from I31 into nodes N3 or N4 in response to C and CB. A T-network of termination resistors R31, R32, and R33 connects between the drain terminals of transistors MN1 and MN2 (nodes N3 and N4) and ground. The circuit further includes a network 300 of isolation transistors that connects nodes N1, N2, N3 and N4 to output terminals T1 and T2. Network 300 includes a first pair of isolation transistors MP3 and MP4 that connect node N1 to terminal T1, a second pair of isolation transistors MP5 and MP6 that connect node N2 to terminal T2, a third pair of isolation transistors MP7 and MP8 that connect node N3 to terminal T1, and a fourth pair of isolation transistors MP9 and MP10 that connect node N4 to terminal T2. In this embodiment, the gate terminals of all of the p-channel isolation transistors connect to a switch control signal Vsw. FIG. 3 further depicts transmission line 302 that is terminated at the far end by a T-network 304 of termination resistors R34, R35, and R36 at the far end of transmission line 302.

The isolation transistors are preferably constructed similar to the isolation transistors described in the above-referenced parent patent application Ser. No. 08/948,218, (Atty Docket No. 010262-0088), entitled "Isolation Circuit for I/O Terminal." A primary transistor (MP3, MP6, MP7, and MP10) has its body terminal switched by a secondary transistor (MP4, MNP5, MP8, and MP9) to its source terminal. This reduces the on resistance of the primary transistors when they are turned on, and floats their body terminal (n-well in this case) when power is off. For the exemplary p-channel implementation shown in FIG. 3, switch control signal Vsw is preferably a negative voltage of, for example, Vsw=−2×|VSS| when power is on. When power is off, Vsw is connected to the most positive pad voltage (i.e., greatest of T1 or T2). Method and circuitry for generating the required voltages for Vsw are described in greater detail in the above-referenced parent application.

The isolation switches operate such that under power off conditions, there are no current paths existing between the transmission line terminals and the power supply nodes. This can be shown by examining, for example, isolation transistor MP10 and current steering transistor MN2. Intrinsic pn junction diodes for these two transistors are shown by diodes D3, D4, D5 and D6. As can be seen, these diodes connect in a back-to-back fashion and when VDD=VSS=0 (i.e., power is off) and Vsw is at the highest voltage between T1 or T2, regardless of the level of voltage at T2, a reverse biased diode exists on the current path between T1 and VSS. Thus, terminals T1 and T2 are perfectly isolated from the current steering transistors inside the driver circuit.

Further, by placing the isolation switches in the current loop (as opposed to the voltage loop), this embodiment does not suffer from the possible disturbance of the matching between termination resistors. For illustrative purposes, assume power is on and Vsw=−2×|VSS|. This turns on isolation transistors MP3 through MP10. With control signal C at a high level, current Io supplied by current source I30 flows through steering transistor MP2 to node N2 and then through isolation transistor MP6 to terminal T2. At node T2, current Io splits into current I(R34) flowing through resistor R34 and current I(R32) flowing through resistor R32. Similarly, 131's current Io flowing through current-steering transistors MN1 is composed of current I(R31) flowing through resistor R31 plus current I(R35) flowing through resistor R35, which arrives via isolation transistor MP7 from terminal T1. The current split in the VSS loop is primarily controlled by the resistive terminations and the on resistance (Rds) of transistors MP7 and MP10. The resistances of MP3 and MP6 are immaterial since they are in series with output of a current source (I30). If these termination resistors are well matched such that R31=R32=R34=R35=R and R33=R36, and the Rds or on resistance of transistors MP7 (Rds7) and MP10 (Rds10) are small enough to avoid voltage limiting the current source devices, then current Io should split equally between R34 and R32 irrespective of the value of Rds7 and Rds10. This provides a voltage difference between T1 and T2 which is exactly equal to the ideal case of 2R×Io.

Thus, the present invention provides circuit techniques that allow the sharing of the same output terminals between transmission line drivers that comply with differing protocols. By inserting isolation transistors along the current loop of a current-output line driver circuit, the invention allows the sharing of output pins while meeting all the power on and power off requirements of different protocols. While the above is a complete description of the preferred embodiment of the present invention, it is possible to use various alternatives, modifications and equivalents. For example, the use of p-channel transistors in an n-well process is for illustrative purposes only, and a similar circuit utilizing n-channel transistors in a p-well process would provide the same operational advantages as the embodiment disclosed. Therefore, the scope of the present invention should be determined not with reference to the above description but should, instead, be determined with reference to the appended claims, along with their full scope of equivalents.

What is claimed is:

1. A transmission line driver circuit comprising:
   a first current source;
   a second current source;
   a first pair of switch transistors coupling the first current source to one of a first or second nodes, respectively;
   a second pair of switch transistors coupling the second current source to one of a third or fourth nodes, respectively;
   a first isolation transistor coupling the first node to first output terminal;
   a second isolation transistor coupling the second node to the second output terminal;
   a third isolation transistor coupling the third node to the first output terminal; and
   a fourth isolation transistor coupling the fourth node to the second output terminal.

2. The transmission line driver circuit of claim 1 wherein the first through fourth isolation transistors are of field effect transistor (FET) type each having its well terminal floating under power off conditions.

3. The transmission line driver circuit of claim 2 wherein, the transmission line driver further comprises:
   a first well-switching FET coupled between a well terminal and source terminal of the first isolation FET;
   a second well-switching FET coupled between a well terminal and source terminal of the second isolation FET;
   a third well-switching FET coupled between a well terminal and source terminal of the third isolation FET; and
   a fourth well-switching FET coupled between a well terminal and source terminal of the fourth isolation FET.

4. The transmission line driver circuit of claim 3 wherein gate terminals of all first to fourth isolation FETs and first to fourth well-switching FETs receive an output isolation control signal.

5. The transmission line driver circuit of claim 4 wherein the first current source couples to a positive power supply, and the second current source couples to a negative power supply, and
   wherein the first and second current-steering FETs respectively receive a current-steering control signal and its complement, and the third and fourth current-steering FETs respectively receive the current-steering control signal and its complement.

6. The transmission line driver circuit of claim 5 wherein the first and second current-steering FETs are of p-channel type, and the third and fourth current-steering FETs are of n-channel type.

7. The transmission line driver circuit of claim 6 wherein the first through fourth isolation FETs and the first through fourth well-switching FETs are of p-channel type.

8. The transmission line driver circuit of claim 7 wherein the isolation control signal receives a voltage that is more negative than that of the negative power supply when power is supplied to the negative and positive power supplies, and when power is off, the isolation control signal receives the highest voltage between voltage of the first output terminal and voltage of the second output terminal.

9. A transmission line driver circuit comprising:
   a first output driver of a first type having a first current requirement, the first output driver having an output node coupled to a first output terminal via a first isolation transistor; and
   a second output driver of a second type having a second current requirement that is different than the first current requirement, the second output driver having an output node coupled to the first output terminal via a second isolation transistor,
   wherein, well terminals of the first and second isolation transistors are biased to ensure that p-n junctions inherent in the isolation transistors that couple to the first output terminal are reverse biased under power off conditions.

10. The transmission line driver circuit of claim 9, wherein the first output driver is of current-output type further comprising a second output node coupled to a second output terminal via a third isolation transistor, and a plurality of current-steering transistors coupling first and second current sources to the first and second output nodes, respectively.

11. A current-output line driver circuit comprising:
   a first current source coupled to a first source of power supply;
   a second current source coupled to a second source of power supply;
   first and second current-steering transistors respectively coupled between the first current source and first and second nodes;
   third and fourth current-steering transistors respectively coupled between the second current source and third and fourth nodes; and
   a plurality of isolation transistors coupled between the first, second, third and fourth nodes and first and second output terminals of the driver circuit,
   wherein, well terminals of the plurality of isolation transistors are biased to ensure that p-n junctions inherent in the isolation transistors that couple to the first and second output nodes are reverse biased under power off conditions.

12. The current-output line driver circuit of claim 11 wherein the plurality of isolation transistors comprise:
   first and second isolation transistors respectively coupling first and second nodes to the first and second output terminals; and
   third and fourth isolation transistors respectively coupling third and fourth nodes to the first and second output terminals.

13. The current-output driver circuit of claim 12 wherein a well terminal of each of the plurality of isolation transistors couples to its source terminal when turned on, and is left floating when turned off.

14. The transmission line driver of claim 9 wherein the well terminals of the isolation transistors are left floating.

15. The transmission line driver of claim 14 wherein the isolation transistors are of p-channel field effect type.

16. The transmission line driver of claim 9 wherein the first output driver is designed to comply with V.35 standard, and the second output driver is designed to comply with RS232 standard.

17. The transmission line driver of claim 1 further comprising a second output driver comprising a pull-up transistor coupled to a pull-down transistor at a common output node, the common output node being coupled to the first output terminal via a fifth isolation transistor.

* * * * *